US008692236B2

United States Patent
Cho et al.

(10) Patent No.: US 8,692,236 B2
(45) Date of Patent: Apr. 8, 2014

(54) METHOD OF MANUFACTURING ORGANIC SEMICONDUCTOR NANOFIBRILLAR NETWORK DISPERSED IN INSULATING POLYMER USING A BLEND OF ORGANIC SEMICONDUCTOR/INSULATING POLYMER AND ORGANIC THIN FILM TRANSISTOR USING THE SAME

(75) Inventors: Kil Won Cho, Gyungbuk (KR); Long Zhen Qiu, Gyungbuk (KR); Wi Hyoung Lee, Gyungbuk (KR)

(73) Assignee: Postech Academy-Industry Foundation, Gyungbuk (KR)

( * ) Notice: Subject to any disclaimer, the term of this patent is extended or adjusted under 35 U.S.C. 154(b) by 43 days.

(21) Appl. No.: 13/140,612

(22) PCT Filed: Apr. 13, 2009

(86) PCT No.: PCT/KR2009/001881
§ 371 (c)(1),
(2), (4) Date: Oct. 13, 2011

(87) PCT Pub. No.: WO2010/071267
PCT Pub. Date: Jun. 24, 2010

(65) Prior Publication Data
US 2012/0018708 A1 Jan. 26, 2012

(30) Foreign Application Priority Data

Dec. 18, 2008 (KR) ........................ 10-2008-0129436

(51) Int. Cl.
*H01L 35/24* (2006.01)
(52) U.S. Cl.
USPC .................................. 257/40; 257/E51.001
(58) Field of Classification Search
USPC ............................................. 257/40, E51.001
See application file for complete search history.

(56) References Cited

U.S. PATENT DOCUMENTS 7,351,606 B2 * 4/2008 Arias ............................... 438/99
(Continued)

FOREIGN PATENT DOCUMENTS

JP    2005-322870    11/2005
(Continued)

OTHER PUBLICATIONS

International Search Report and Written Opinion of the World Intellectual Property Office, dated Jan. 13, 2010.
(Continued)

*Primary Examiner* — Anthony Ho
(74) *Attorney, Agent, or Firm* — Thompson Hine LLP

(57) ABSTRACT

Disclosed is a method of manufacturing an organic semiconductor thin film for an organic thin film transistor from a blend of organic semiconductor/insulating polymer. The organic semiconductor thin film is configured such that organic semiconductor nanofibrils are dispersed in the form of a network in the insulating polymer layer. This organic semiconductor thin film is formed by dissolving the blend of organic semiconductor/insulating polymer in a marginal solvent of the organic semiconductor or mixed solvent thus preparing a blend solution, which is then applied while adjusting the solubility of the solution. An organic thin film transistor using the organic semiconductor thin film is also provided. The blend thin film of organic semiconductor/insulating polymer containing only about 3 wt % of the organic semiconductor exhibits electrical properties equal to those of a thin film composed exclusively of an organic semiconductor. The insulating polymer acts as a protective layer of the organic thin film transistor, thus obviating a need for forming the protective layer.

15 Claims, 5 Drawing Sheets

P3HT/PS blend in CH$_2$Cl$_2$
~ 40 °C

Substrate at room temperature

Nanofibers embedded in PS matrix

(56) References Cited

U.S. PATENT DOCUMENTS

| | | |
|---|---|---|
| 2004/0241900 A1 | 12/2004 | Tsukamoto et al. |
| 2005/0221530 A1* | 10/2005 | Cheng et al. ............... 438/82 |
| 2008/0038867 A1 | 2/2008 | Shin et al. |

FOREIGN PATENT DOCUMENTS

| | | |
|---|---|---|
| JP | 2006-013492 | 1/2006 |
| JP | 2008-147225 | 6/2008 |
| KR | 20070121892 | 12/2007 |
| WO | 2005/078770 A2 | 8/2005 |
| WO | 2006/091823 A2 | 8/2006 |
| WO | WO 2008/001123 | 1/2008 |

OTHER PUBLICATIONS

International Preliminary Report on Patentability of the World Intellectual Property Office, dated Jun. 21, 2011.

Arias et al., "Surface-Induced Self-Encapsulation of Polymer Thin-Film Transistors," Advanced Materials, vol. 18 (2006), pp. 2900-2904.

Goffri et al., "Multicomponent Semiconducting Polymer Systems with Low Crystallization-Induced Percolation Threshold," Nature Materials, vol. 5 (2006), pp. 950-956.

Kanemoto et al., Effect of the Dilution in Polypropylene on Photophysical Properties of Poly(3-alkylthiophenes), Synthetic Metals, vol. 155 (2005), pp. 162-167.

Lu et al., "Enhanced Electrical Conductivity of Highly Crystalline Polythiophene/Insulating-Polymer Composite," Macromolecules, vol. 40 (2007), pp. 6579-6584.

Qiu et al., "Versatile Use of Vertical-Phase-Separation-Induced Bilayer Structures in Organic Thin-Film Transistors," Advanced Materials, vol. 20 (2008), pp. 1141-1145.

Supplementary European Search Report, European Patent Application No. 09833545.8, mailed Apr. 19, 2013 (10 pages).

Qiu et al. One-step fabrication of high performance organic field-effect transistors from semiconductor/dielectric blends. Proc. of SPIE, 7054 (2008) 70540N-1-8.

Yang et al. Crystalline structures in organic semiconductors for high-performance OTFT applications. Proc. of SPIE 6336 (2006) 63360B-1-15.

Samitsu et al. Nanofiber preparation by whisker method using solvent-soluble conducting polymers, Thin Solid Films 516 (2008) 2478-86.

Merlo and Frisbie. Field Effect Transport and Trapping in Regioregular Polythiophene Nanofibers. J. Phys. Chem. B 108 (2004) 19169-19179.

Surin et al. Relationship between the microscopic morphology and the charge transport properties in poly(3-hexylthiophene) field-effect transistors. Journal of Applied Physics, 100 (2006) 033712-1-6.

PCT/KR2009/001881 (published Jun. 24, 2010).

International Search Report, dated Jan. 13, 2010.

* cited by examiner

P3HT/PS (5/95) in Dioxane/Chloroform (x/y)

METHOD OF MANUFACTURING ORGANIC SEMICONDUCTOR NANOFIBRILLAR NETWORK DISPERSED IN INSULATING POLYMER USING A BLEND OF ORGANIC SEMICONDUCTOR/INSULATING POLYMER AND ORGANIC THIN FILM TRANSISTOR USING THE SAME

TECHNICAL FIELD

The present invention relates to a method of manufacturing an organic semiconductor thin film for use in fabrication of an organic thin film transistor (OTFT), and, more particularly, to an organic semiconductor thin film which is provided in the form of a semiconducting nanofibrillar network dispersed in insulating polymer using a blend of an organic semiconductor and an insulating polymer and to a high-performance OTFT using the organic semiconductor thin film.

BACKGROUND ART

Generally, an OTFT, which is a device for driving a next-generation display, is under active study. The OTFT includes, as a semiconductor layer, an organic film in lieu of a silicon film, and is classified into a small molecular OTFT such as oligothiophene, pentacene and so on, and into a polymer OTFT such as polythiophene and so on, depending on the type of material of the organic film.

An organic electroluminescent display using the OTFT as a switching device includes a plurality of pixels arranged in the form of a matrix on a substrate, each pixel being provided with an organic electroluminescent device including two OTFTs, for example, a switching OTFT and a driving OTFT, a capacitor, upper and lower electrodes, and an organic film disposed between the upper and lower electrodes.

Typically, a flexible organic electroluminescent display includes a flexible substrate as a substrate. The flexible substrate includes a plastic substrate. The plastic substrate has very poor thermal stability and thus requires a low-temperature process to manufacture an organic electroluminescent display.

Hence, because the OTFT using the organic semiconductor thin film as the semiconductor layer may be subjected to a low-temperature process, it is receiving attention as a switching device for a flexible organic electroluminescent display.

However, materials usable for the organic semiconductor layer are problematic in that they are relatively expensive. For this reason, the demand for methods of reducing the manufacturing cost of the OTFT by using the expensive organic semiconductor in a small amount continues.

In the case where the organic semiconductor material is exposed to the surface, the properties thereof may change due to environmental causes, and thus there is an additional need for a protective layer for protecting it. When the protective layer is formed on the organic semiconductor layer through a solution process, problems of damage to already-made underlayers due to the solvent used in subsequent processes may occur. In order to more effectively achieve the solution process, research into fabrication of a multilayered thin film through a single coating process is being conducted.

Thus, attempts to blend the organic semiconductor polymer with the insulating polymer so as to combine the electrical properties of the organic semiconductor, the mechanical properties of the insulating polymer, and the material properties of the inexpensive material are being made.

Recently, H. Sirringhaus Group, UK, has succeeded in the manufacture of a device able to maintain charge mobility even when poly-3-hexyl thiophene (P3HT) is used only in an amount of about 3 wt % upon blending of P3HT which is a type of organic semiconductor with polystyrene (PS) or polyethylene (PE) which is an insulting polymer, and the results thereof are reported in Nature Materials, 5, 956 (2006) and disclosed in PCT patent WO 2008/001123 A1. However, in the case of this method, the device able to maintain charge mobility despite the use of a small amount of P3HT may be manufactured only under a condition in which the insulating polymer used is a crystalline polymer, for example, isotactic-PS or high-density PE. The reason is that P3HT is spread on the substrate while being crystallized, and the insulating polymer is then formed on the P3HT layer, thus obtaining a structure in which the P3HT layer and the insulating polymer layer are vertically phase-separated on the substrate. Accordingly, even when P3HT is used in a small amount, a charge transfer passage may be formed between source and drain electrodes. However, this method is difficult to commercialize because of a complicated manufacturing process including the crystallization of P3HT and then the solidification of the insulating polymer. Further, because a drop-casting process is adopted, it makes it difficult to manufacture a device through application of a uniform film on a large area.

Using a blend of P3HT and polymethylmethacrylate (PMMA), P3HT and PMMA are vertically phase-separated on the substrate so that the PMMA layer is located on the P3HT layer to thus use the PMMA layer as the protective layer of the P3HT layer, which was studied by A. Arias in Palo Alto Research Center (Adv. Mater. 19, 2900 (2006)). However, PMMA has a limitation in that it is only used as the protective layer, and also, P3HT should be added up to 40% and is thus unfavorable in terms of reducing the use of the organic semiconductor.

The present research group has recently studied use of PMMA as the dielectric layer of the OTFT through vertical phase separation of a blend of P3HT and PMMA such that PMMA is located at a lower position and P3HT is located at an upper position on the substrate (Adv. Mater, 20, 1141 (2008)). In this case, even when 3 wt % of P3HT is used, the OTFT has performance equal to that of an OTFT manufactured using 100% P3HT. Because the manufacturing process is performed through spin casting, commercialization is possible compared to research results of H. Sirringhaus Group.

According to all of the aforementioned results, the charge transfer passage may be maintained in a lateral direction even when the organic semiconductor is added in a small amount to the blend of organic semiconductor and insulating polymer due to vertical phase separation on the substrate. However, because various factors (solvent evaporation rate, surface energy of substrate, concentration of solution, etc.) are involved in the vertical phase separation, many limitations are imposed on the vertical phase separation on the substrate. Also, a horizontal phase separation force coexists with a vertical phase separation force in the polymer blend, and thus it is difficult to uniformly achieve the vertical phase separation on a large area.

Therefore, methods of easily manufacturing a thin film of a blend of organic semiconductor and insulating polymer having superior electrical and physical properties even with the use of a small amount of organic semiconductor are in constant demand.

Hence, the present invention is intended to provide a method of manufacturing a novel functional thin film in which organic semiconductor nanofibrils are dispersed in the form of a network in the insulating polymer layer using a blend of organic semiconductor/insulating polymer, and fabrication of an OTFT having superior performance (i.e., improved environmental stability) even when using a small amount of organic semiconductor.

DISCLOSURE OF INVENTION

Technical Problem

Accordingly, the present invention provides a high-performance polymer thin film including a small amount of organic semiconductor.

Also, the present invention provides a method of manufacturing the high-performance polymer thin film including a small amount of organic semiconductor.

Also, the present invention provides a coating solution for use in the formation of the high-performance polymer thin film including a small amount of organic semiconductor.

Also, the present invention provides a transistor including a layer in which organic semiconductor nanofibrils are dispersed so as to be interconnected.

In addition, the present invention provides a method of manufacturing the transistor including a layer in which organic semiconductor nanofibrils are dispersed so as to be interconnected.

Technical Solution

An aspect of the present invention provides a semiconductor thin film including a polymer matrix and an organic semiconductor dispersed in the polymer matrix so as to be interconnected. The semiconductor thin film according to the present invention is configured such that organic semiconductor nanofibrils are dispersed in the polymer matrix.

In the present invention, the organic semiconductor nanofibrils may be interconnected in the form of a network.

In an embodiment of the present invention, the organic semiconductor nanofibrils may be a polymer, in particular, a semi-crystalline polymer which may be precipitated in the form of nanofibrils through reduction in solubility of a solution. Examples of the polymer include P3HT, PQT-12 and so on.

In the present invention, the organic semiconductor nanofibrils which are interconnected in the form of a network may be used in an amount of 10 wt % or less, preferably 5 wt % or less, and more preferably about 2 wt % based on the total weight of the blend solution, in order to obtain sufficient charge transfer properties.

In the present invention, the polymer matrix may protect the organic semiconductor nanofibrils dispersed in the form of a network from the external environment, and includes various amorphous thermoplastic or thermosetting polymers, preferable examples thereof including polystyrene, PMMA, and epoxy.

In the present invention, the semiconductor nanofibrils may be uniformly dispersed in the entire region of the polymer matrix, including the top surface, the mid portion, and the bottom surface.

Another aspect of the present invention provides a method of manufacturing the semiconductor thin film including dissolving the blend of organic semiconductor and insulating polymer in a marginal solvent of the organic semiconductor thus preparing a blend solution, and then applying the blend solution, in which a solubility of the blend solution is reduced so that the organic semiconductor nanofibrils are dispersed in the insulating polymer.

In the present invention, the organic semiconductor may include an organic semiconductor which may be precipitated in the form of nanofibrils through reduction of the solubility of the solution, and an example thereof includes a semi-crystalline polymer, for example, P3HT.

In the present invention, the reduction of the solubility of the solution may be performed in various ways. In an embodiment of the present invention, the solubility of the solution may be reduced through cooling. Preferably, in the case where the solvent of the solution is a marginal solvent for completely dissolving the organic semiconductor at a high temperature and precipitating the organic semiconductor at room temperature, a coating process is performed at room temperature without additional cooling, thus forming the nanofibrils. An example of the marginal solvent is dichloromethane in the case where the organic semiconductor is P3HT.

In another embodiment of the present invention, the solubility of the solution may be reduced through the addition of a low-solubility solvent, thus precipitating the organic semiconductor. The solvent may have solubility to the extent that the organic semiconductor is completely soluble at a coating temperature, and the low-solubility solvent may have solubility in which the organic semiconductor is insoluble at a coating temperature. For example, in the case where P3HT is used as the semiconductor material, chloroform or chlorobenzene may be used as the solvent, and dioxane, acetonitrile or ethanol may be used as the low-solubility solvent. The low-solubility solvent is preferably used as an adjuvant solvent, and the amount thereof should not exceed 50 wt %.

In the present invention, the solution having a concentration of about 1 wt % obtained by blending 0.1~50 wt % of the organic semiconductor with 50~99.9 wt % of the polymer matrix may be applied. The application of the solution may be performed through a known coating process, such as spin coating, and is not particularly limited.

A further aspect of the present invention provides a coating solution obtained by dissolving an organic semiconductor material and a polymer matrix material, in which the organic semiconductor material is precipitated in the form of nanofibrils through the reduction of the solubility of the solution. Examples of the organic semiconductor material which is precipitated in the form of nanofibrils through the reduction of the solubility include semi-crystalline polymer materials, such as P3HT, PQT-12 and so on.

The organic semiconductor may be used in as small an amount as possible, as long as the semiconductor properties may be appropriately exhibited after a coating process. The organic semiconductor may be used in an amount of 0.1 wt % or more, and preferably 1 wt % or more, based on the total weight of the thin film composed of the organic semiconductor material and the polymer matrix material. In order to generate economic benefits, the organic semiconductor is used in an amount of 10 wt % or less. The coating solution may have a concentration adequate for a typical spin coating process, for example, about 1 wt %.

Still a further aspect of the present invention provides an OTFT, including a gate electrode formed on a substrate, a gate insulating film insulated from the gate electrode, source and drain electrodes, and a thin film in which the organic semiconductor nanofibrils are dispersed in the polymer matrix so as to connect the source and drain electrodes to each other.

In the present invention, the organic semiconductor nanofibrils are dispersed in the top surface, the inside and the bottom surface of the thin film and the interface thereof with the insulating film so as to be interconnected in the form of a network in the polymer matrix in a thin film form, thus connecting the source and drain electrodes to each other.

Although not theoretically limited, even when the organic semiconductor which is provided in the form of an interconnected nanofibrillar network is contained in an amount of about 0.1 wt % and preferably about 1 wt % in the thin film, this thin film may exhibit electrical properties equal to those of a thin film composed exclusively of an organic semiconductor.

In the present invention, the polymer matrix may be formed so that the nanofibrils dispersed therein may have resistance to thermal deformation, water, oxygen and bending stress, and examples thereof include thermoplastic resins such as polystyrene and PMMA, and thermosetting resins such as epoxy.

In the present invention, the gate, the source and the drain electrodes and the insulating layer may be formed through a known OTFT manufacturing process, and are not particularly limited.

Still another aspect of the present invention provides a method of manufacturing the OTFT, including forming a gate electrode on a substrate, providing a gate insulating film which is insulated from the gate electrode, forming source and drain electrodes, and applying a solution of organic semiconductor material and insulating polymer, in which a solubility of the solution is reduced so that the semiconductor nanofibrils are precipitated, thus forming a thin film for connecting the source and drain electrodes to each other.

In the present invention, the solubility of the solution is reduced by lowering the temperature of the solution. A marginal solvent in which the organic semiconductor and the polymer matrix are completely dissolved at a warm temperature of about 40° C. and in which only the organic semiconductor is precipitated at room temperature may be used. In this case, during the coating process at room temperature, the organic semiconductor may be formed into a nanofibrillar network. In an embodiment of the present invention, when a semi-crystalline polymer such as P3HT or PQT-12 is used as the semiconductor material, a marginal solvent such as dichloromethane may be used.

In the present invention, in the case where a low-solubility solvent in which the organic semiconductor is insoluble is added to the solution of organic semiconductor and insulating polymer, the solubility of the solution is reduced, and thus the organic semiconductor is precipitated in the form of interconnected nanofibrils. In an embodiment of the present invention, in the case where P3HT is used as the organic semiconductor material, the low-solubility solvent such as dioxane, acetonitrile or ethanol may be used.

The organic semiconductor thin film according to the present invention may be used as a charge transport material, element or device, and also applied to optical, opto-electronic or electronic devices, transistors, integrated circuits, solar cells or organic luminescent devices.

The thin film in which the organic semiconductor nanofibrils are dispersed in the polymer matrix according to the present invention may be widely applied to transistors for flat displays, transistor arrays, RFID tags, electroluminescent displays, backlight units, field effect transistors, direct circuits, thin film transistors, or organic luminescent devices.

Advantageous Effects

According to the present invention, the organic semiconductor thin film is configured such that organic semiconductor nanofibrils are dispersed in an insulating polymer matrix so as to be interconnected. Hence, even when the organic semiconductor is used in a small amount, high-performance electrical properties can be exhibited. The organic semiconductor is dispersed in the insulating polymer matrix, and thus can manifest resistance to oxygen, water, thermal stress or bending stress.

Also, in the methods of manufacturing the organic semiconductor thin film and the OTFT according to the present invention, the organic semiconductor thin film and the protective layer can be formed through a single process, thus generating economic benefits.

MODE FOR THE INVENTION

Fabrication of Transistor

Example 1

A field effect transistor having a bottom gate contact structure using, as a gate electrode, an overdoped n-type Si wafer having a layer of thermally oxidized SiO$_2$ (capacitance=10.8 nFcm$^{-2}$) 300 nm thick as a gate dielectric layer was manufactured. The surface of SiO$_2$ was washed with a Piranha solution and then distilled water, after which the substrate was stored in a vacuum oven. Then, gold was deposited (to a thickness of 100 nm on a titanium adhesive layer 2 nm thick) through a shadow mask, thus forming source and drain electrodes. The channel was 100 µm long and 800 µm wide.

Subsequently, P3HT (Mw=40 kg/mol) and amorphous PS (Mw=240 kg/mol) were dissolved at various ratios (P3HT/PS: 100%/0%~0.1%/99.9%) in dichloromethane, thus preparing a 0.5 vol % coating solution, which was then heated to about 40° C. to efficiently dissolve a sample and then applied through spin coating, thus forming a thin film. A sample using a chloroform solution instead of dichloromethane was prepared through the same process, and the thin film properties and the OTFT performance were measured and compared.

Example 2

In order to manufacture a flexible transistor, a polyarylate substrate was spin coated with PEDOT/PSS water-based ink, thus forming a gate electrode. Then, a propyleneglycol monomethyl ether acetate (PGMEA) solution containing 11 wt % of poly-4-vinylphenol (PVP, Mw=20,000 g/mol) and wt % of poly(melamine-co-formaldehyde)methylated (PMF, Mw=20,000 g/mol) was applied through spin coating at about 2000 rpm, and stored in a vacuum oven so as to be crosslinked at 180° C. for 1 hour, thus forming a dielectric layer (capacitance=6.6 nFcm$^{-2}$) 600 nm thick. Then, source and drain electrodes were formed using gold.

Subsequently, P3HT and PS were dissolved at various ratios in dichloromethane, thus preparing a 0.5 vol % coating solution, which was then heated to about 40° C. to efficiently dissolve a sample and then applied through spin coating, thus forming a thin film.

Example 3

A field effect transistor having a bottom gate contact structure using, as a gate electrode, an overdoped n-type Si wafer having a layer of thermally oxidized SiO$_2$ (capacitance=10.8 nFcm$^{-2}$) 300 nm thick as a gate dielectric layer was manufactured. The surface of SiO$_2$ was washed with a Piranha solution and then distilled water, after which the substrate was stored in a vacuum oven. Then, gold was deposited (to a thickness of 100 nm on a titanium adhesive layer 2 nm thick) through a shadow mask, thus forming source and drain electrodes. The channel was 100 µm long and 800 µm wide.

Subsequently, P3HT and PS were dissolved at various ratios (P3HT/PS: 100%/0%~0.1%/99.9%) in a solvent mixture of chloroform/dioxane (chloroform/dioxane: 100%/0%~50%/50%), thus preparing a 0.5 vol % coating solution, which was then applied through spin coating, thus forming a thin film.

Measurement of Performance

Figure 1:
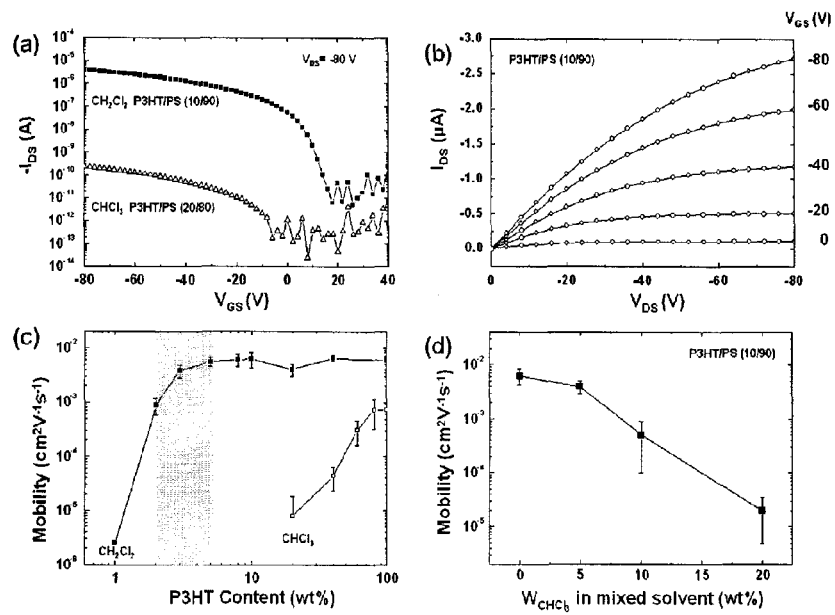
FIGS. 1A to 1D show the field effect transistor performance of P3HT/PS blend solutions in $CH_2Cl_2$ and $CHCl_3$, in which $I_{DS}$ indicates the drain-source current, $V_{DS}$ indicates the drain-source voltage and $V_{GS}$ indicates the gate-source voltage, FIG. 1A showing typical transfer properties of an apparatus including a thin film of P3HT/PS (10/90) in $CH_2Cl_2$ and of an apparatus including a thin film of P3HT/PS (20/90) in $CHCl_3$, FIG. 1B showing output properties of the apparatus including the thin film of P3HT/PS (10/90) in $CH_2Cl_2$, FIG. 1C showing an average field effect mobility measured in the saturated region versus the P3HT content in the blend, FIG. 1D showing the field effect mobility of the P3HT/PS (10/90) blend versus the $CHCl_3$ content in a solvent mixture of $CH_2Cl_2/CHCl_3$.
Figure 2:
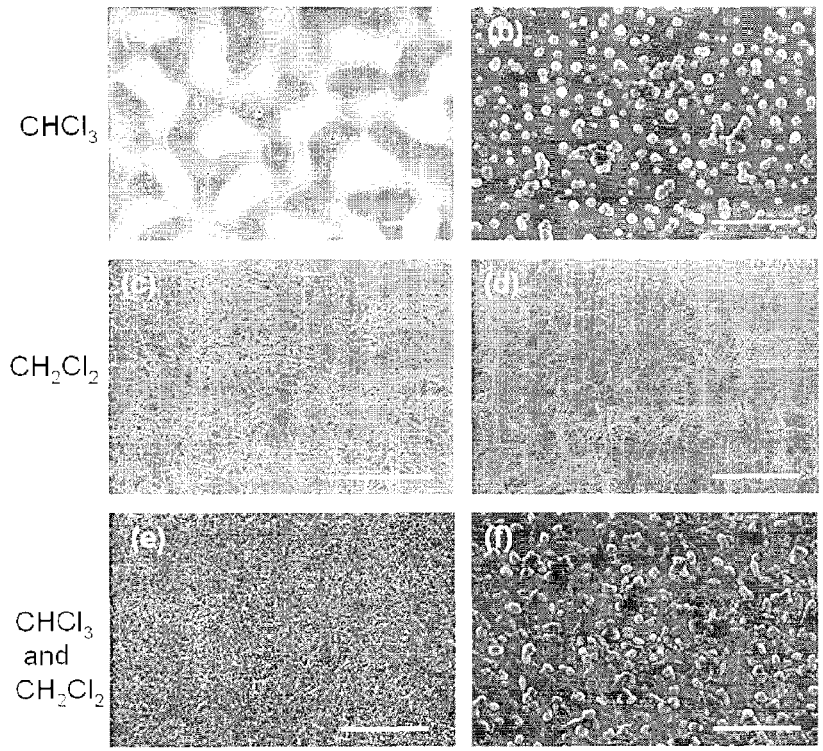
FIGS. 2A to 2F show SEM images after subjecting the P3HT/PS films having various P3HT contents, prepared through spin casting using $CHCl_3$, $CH_2Cl_2$ and a solvent mixture thereof, to selective removal of PS with cyclohexane, in which the scale bar represents 1 micrometer, FIGS. 2A and 2B showing the films spin cast respectively using 60% and 10% of P3HT in $CHCl_3$, FIGS. 2C and 2D showing the films spin cast respectively using 10% and 5% of P3HT in $CH_2Cl_2$, and FIGS. 2E and 2F showing the films spin cast using the P3HT/PS (10/90) blend in the solvent mixture of $CHCl_3/CH_2Cl_2$ at 5/95 and 10/90 respectively.
Figure 3:
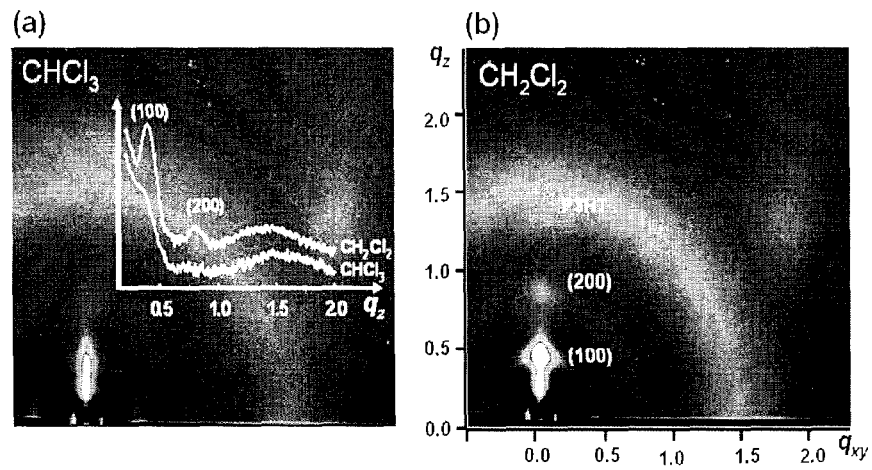
FIGS. 3A and 3B show 2D grazing incidence X-ray diffraction (GIXRD) of the P3HT/PS (10/90) films spin cast using $CHCl_3$ and $CH_2Cl_2$ respectively, the graph included in FIG. 3A representing the 1D out-of-plane X-ray profile obtained from the 2D pattern.
Figure 4:
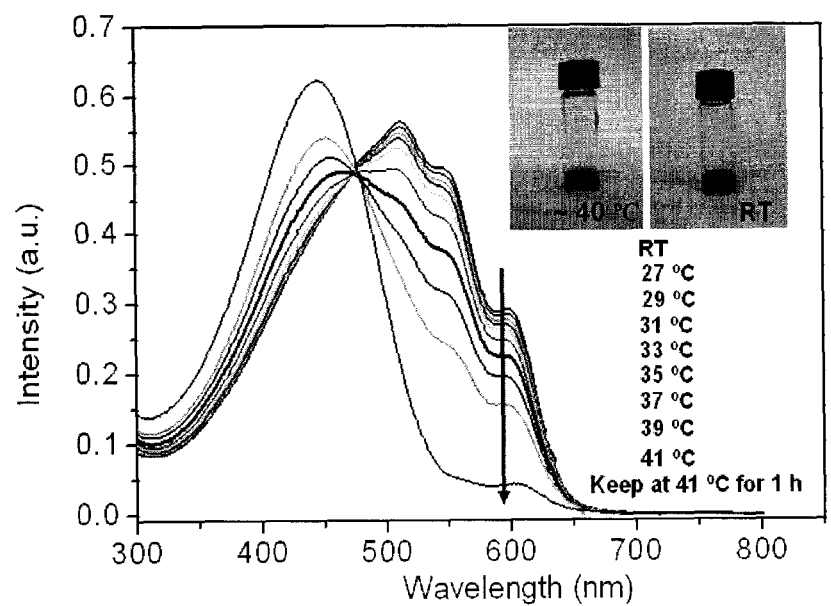
FIG. 4 shows the absorption spectrum of the 0.5 vol % P3HT/PS (10/90) solution in $CH_2Cl_2$ depending on the temperature, the photographs included in FIG. 4 being photographs showing the solution at about 40° C. and the solution at room temperature.
Figure 5:
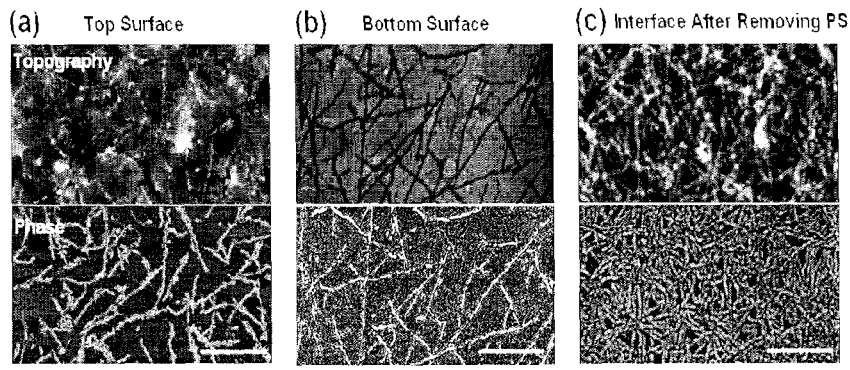
FIG. 5A shows the AFM image of the top surface of the P3HT/PS (5/95) film, FIG. 5B showing the AFM image of the surface thereof in contact with the substrate.
FIG. 5C shows the AFM image thereof after selective removal of PS with cyclohexane.
Figure 6:
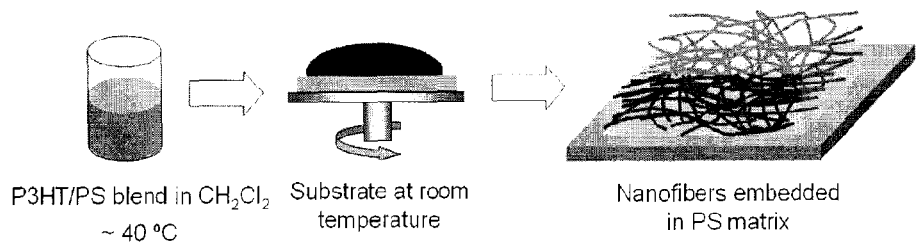
FIG. 6 schematically shows a process of manufacturing a structure in which organic semiconductor nanofibrils are dispersed in an insulating polymer matrix using the P3HT/PS blend.
Figure 7:
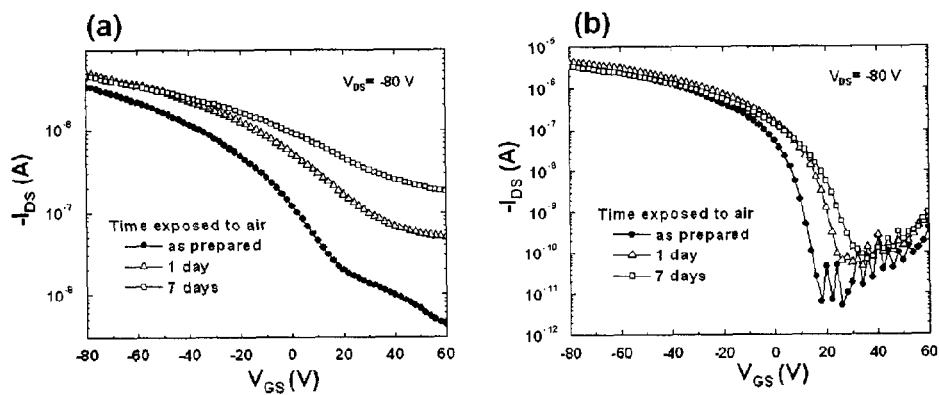
FIGS. 7A and 7B show the changes in transfer properties of the film spin cast using the P3HT solution in $CH_2Cl_2$ and of the film spin cast using the P3HT/PS (10/90) blend solution in $CH_2Cl_2$ respectively, depending on the time exposed to air.
Figure 8:
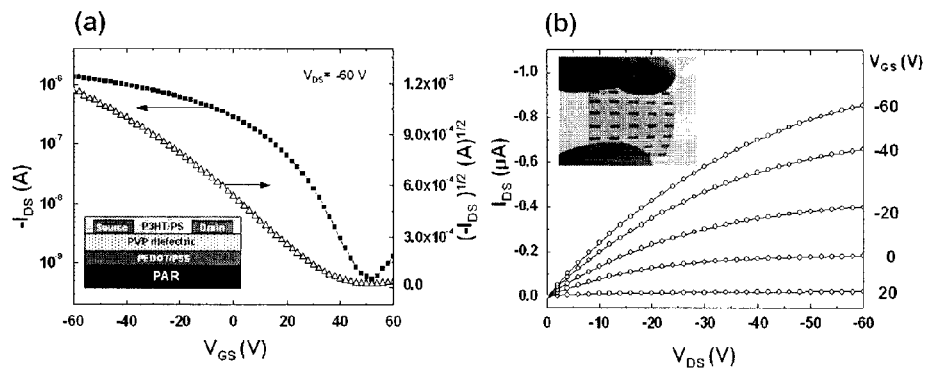
FIGS. 8A and 8B show typical transfer properties and output properties respectively of the TFT obtained through spin casting of the P3HT/PS (10/90) blend solution in $CH_2Cl_2$ on the flexible substrate, the view included in FIG. 8A showing a schematic cross-section of the TFT, and the view included in FIG. 8B showing a digital camera image of the P3HT/PS TFT on the flexible substrate.
Figure 9:
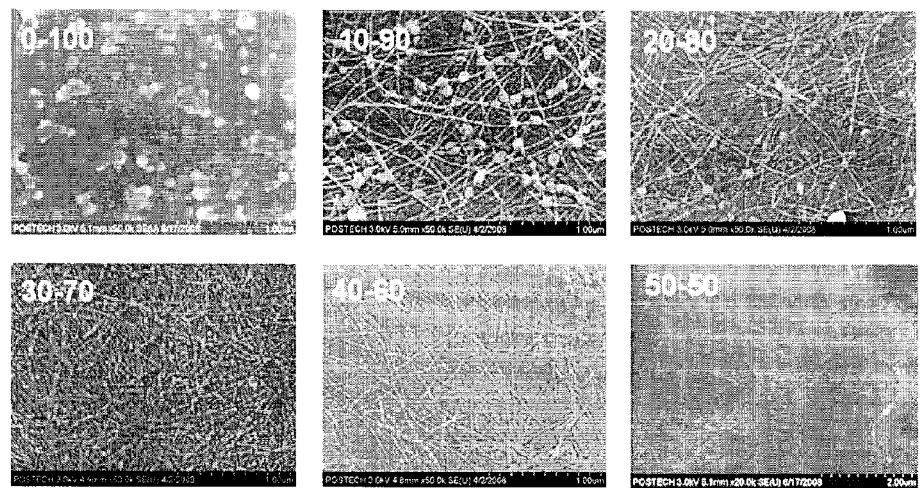
FIG. 9 shows SEM images of the thin film obtained by preparing a P3HT/PS (5/95) blend solution using a solvent mixture of dioxane/CHCl$_3$ and then spin casting the blend solution thus forming a thin film from which PS is then selectively removed, the numerals in the drawings showing the mixing ratio of dioxane/CHCl$_3$.
Figure 10:
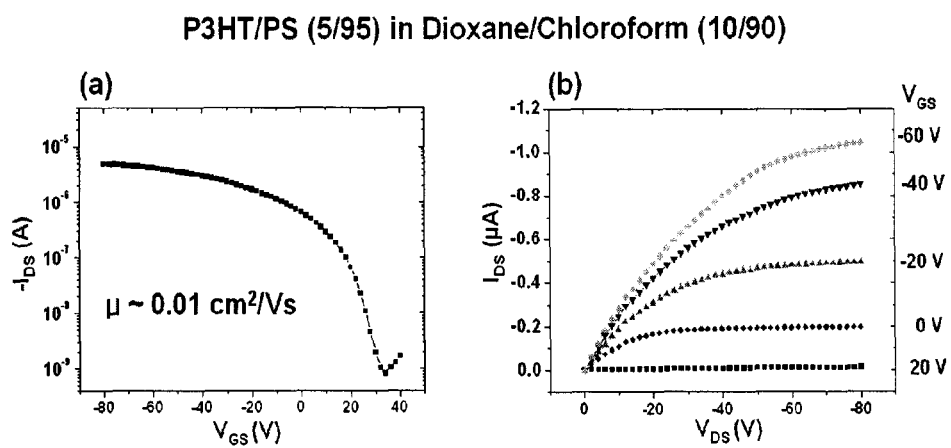
FIGS. 10A and 10B show typical transfer properties and output properties respectively of a TFT including a thin film obtained by preparing a P3HT/PS (5/95) blend solution using a solvent mixture of dioxane/CHCl$_3$ (10/90) and then spin casting the blend solution.

The performance of the transistors of Examples 1 and 2 was measured. The results are shown in FIGS. 1 to 8. The performance of the transistors of Example 3 is shown in FIG. 10. The performance of the transistor was measured at room temperature using Keithley 4200 and 236 source/measure units. The capacitance was measured using an Agilent 4284 precision LCR meter. The film morphology was observed using an atomic force microscope (AFM) (Digital Instruments Multimode), and a field-emission scanning electron microscope (FE-SEM, Hitachi S-4800). The 2D grazing incidence X-ray diffraction (GIXRD) was measured using 4C2 beam lines of a Pohang Light Source.

The invention claimed is:
1. A method of manufacturing an organic semiconductor thin film, comprising dissolving poly-3-hexyl thiophene organic semiconductor and polystyrene insulating polymer thus preparing a solution, and then applying the solution, in which a solubility of the solution is reduced, thus forming a polymer thin film in which the poly-3-hexyl thiophene organic semiconductor is interconnected and dispersed in the entire region of the polystyrene insulating polymer in a form of nanofibrils.

2. The method according to claim 1, wherein the solubility of the solution is reduced by cooling the solution.

3. The method according to claim 2, wherein the solution is prepared using a marginal solvent.

4. The method according to claim 2, wherein the organic semiconductor is precipitated at room temperature.

5. The method according to claim 1, wherein the solubility of the solution is reduced by adding a low-solubility solvent to the solution.

6. The method according to claim 1, wherein the organic semiconductor is a semi-crystalline polymer.

7. The method according to claim 6, wherein the thin film is formed through spin casting or drop casting.

8. A method of manufacturing an organic thin film transistor, comprising:
   forming a gate electrode on a substrate;
   providing a gate insulating film insulated from the gate electrode;
   forming source and drain electrodes on the insulating film; and
   applying a solution of poly-3-hexyl thiophene organic semiconductor material and polystyrene insulating polymer, in which a solubility of the solution is reduced so as to precipitate organic semiconductor nanofibrils, thus forming a thin film for connecting the source and drain electrodes to each other, wherein the thin film comprises the polystyrene insulating polymer matrix and poly-3-hexyl thiophene organic semiconductor nanofibrils dispersed in a network form in the entire region of the polystyrene insulating polymer matrix.

9. The method according to claim 8, wherein the solubility of the solution is reduced by lowering a temperature of the solution.

10. The method according to claim 9, wherein the solution forms the semiconductor nanofibrils at room temperature.

11. The method according to claim 8, wherein the solubility of the solution is reduced by adding a low-solubility solvent to the solution.

12. The method according to claim 11, wherein the low-solubility solvent is dioxane, acetonitrile, or ethanol.

13. The method according to claim 8, wherein the organic semiconductor is contained in an amount of 0.1-50 wt % in the thin film.

14. The method according to claim 8, wherein the applying the solution is performed through spin casting or drop casting.

15. The method according to claim 8, wherein the substrate is a silicon substrate or a flexible substrate.

\* \* \* \* \*